US012288809B2

(12) United States Patent
Fan et al.

(10) Patent No.: US 12,288,809 B2
(45) Date of Patent: Apr. 29, 2025

(54) SEMICONDUCTOR DEVICE WITH DOPED STRUCTURE

(71) Applicant: Taiwan Semiconductor Manufacturing Co., Ltd., Hsinchu (TW)

(72) Inventors: Miao-Syuan Fan, Hsinchu (TW); Pei-Wei Lee, Hsinchu (TW); Ching-Hua Lee, Hsinchu (TW); Jung-Wei Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/612,701

(22) Filed: Mar. 21, 2024

(65) Prior Publication Data

US 2024/0234506 A1 Jul. 11, 2024

Related U.S. Application Data

(63) Continuation of application No. 17/650,867, filed on Feb. 14, 2022, now Pat. No. 11,990,512, which is a
(Continued)

(51) Int. Cl.
*H01L 29/08* (2006.01)
*H01L 21/8234* (2006.01)
(Continued)

(52) U.S. Cl.
CPC .. *H01L 29/0847* (2013.01); *H01L 21/823412* (2013.01); *H01L 21/823418* (2013.01);
(Continued)

(58) Field of Classification Search
CPC ............. H01L 29/0847; H01L 29/1037; H01L 29/401; H01L 29/41791; H01L 29/42356;
(Continued)

(56) References Cited

U.S. PATENT DOCUMENTS 5,808,321 A * 9/1998 Mitanaga .......... H01L 29/66757
257/70
6,194,293 B1 * 2/2001 Krivokapic ....... H01L 29/66537
257/E21.345
(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

*Primary Examiner* — Dao H Nguyen
(74) *Attorney, Agent, or Firm* — Sterne, Kessler, Goldstein & Fox P.L.L.C.

(57) ABSTRACT

The present disclosure relates to a semiconductor device includes first and second source/drain (S/D) regions doped with lead (Pb) at a first dopant concentration. The semiconductor device also includes a channel region between the first and second S/D regions, where the channel region is doped with Pb at a second dopant concentration that is lower than the first dopant concentration. The semiconductor device further includes first and second S/D contacts in contact with the first and second S/D regions, respectively. The semiconductor device also includes a gate electrode over the channel region.

20 Claims, 10 Drawing Sheets

Related U.S. Application Data continuation of application No. 16/937,365, filed on Jul. 23, 2020, now Pat. No. 11,251,268.

(60) Provisional application No. 62/966,866, filed on Jan. 28, 2020.

(51) Int. Cl.
*H01L 27/088* (2006.01)
*H01L 29/10* (2006.01)
*H01L 29/40* (2006.01)
*H01L 29/417* (2006.01)
*H01L 29/423* (2006.01)
*H01L 29/66* (2006.01)
*H01L 29/78* (2006.01)

(52) U.S. Cl.
CPC .. *H01L 21/823431* (2013.01); *H01L 27/0886* (2013.01); *H01L 29/1037* (2013.01); *H01L 29/401* (2013.01); *H01L 29/41791* (2013.01); *H01L 29/42356* (2013.01); *H01L 29/66795* (2013.01); *H01L 29/785* (2013.01)

(58) Field of Classification Search
CPC ............. H01L 29/66795; H01L 29/167; H01L 21/823412; H01L 21/823418; H01L 21/823431; H01L 27/0886
See application file for complete search history.

(56) References Cited

U.S. PATENT DOCUMENTS

| | | | |
|---|---|---|---|
| 6,287,922 B1* | 9/2001 | Yu ..................... | H01L 29/6659 438/303 |
| 6,342,409 B1 | 1/2002 | Seo | |
| 7,015,116 B1 | 3/2006 | Lo et al. | |
| 7,091,114 B2 | 8/2006 | Ito et al. | |
| 7,118,979 B2* | 10/2006 | Liu .................... | H01L 21/28105 257/E21.345 |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 10,249,767 B2 | 4/2019 | Sasaki et al. | |
| 11,081,563 B2* | 8/2021 | Tsai .................. | H01L 29/41725 |
| 11,251,268 B2 | 2/2022 | Fan et al. | |
| 2002/0020840 A1 | 2/2002 | Nakajima | |
| 2005/0048779 A1 | 3/2005 | Ito | |
| 2005/0082573 A1* | 4/2005 | Williford .......... | H01L 29/66537 257/E29.264 |
| 2011/0240998 A1* | 10/2011 | Morosawa ........ | H01L 29/78618 257/E29.273 |
| 2018/0076330 A1 | 3/2018 | Morosawa | |

OTHER PUBLICATIONS

Luo, Jie-Xin, et al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

* cited by examiner

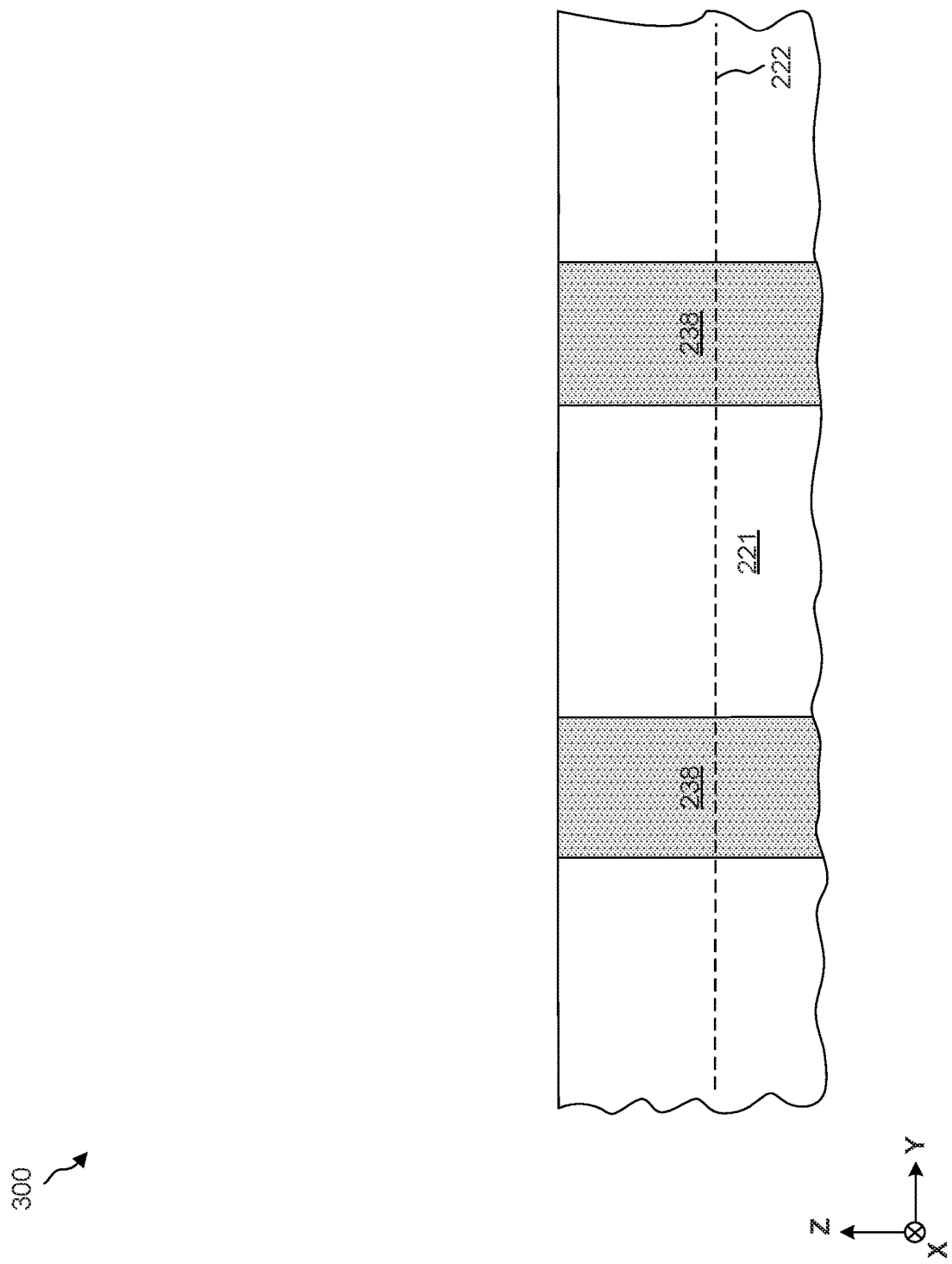

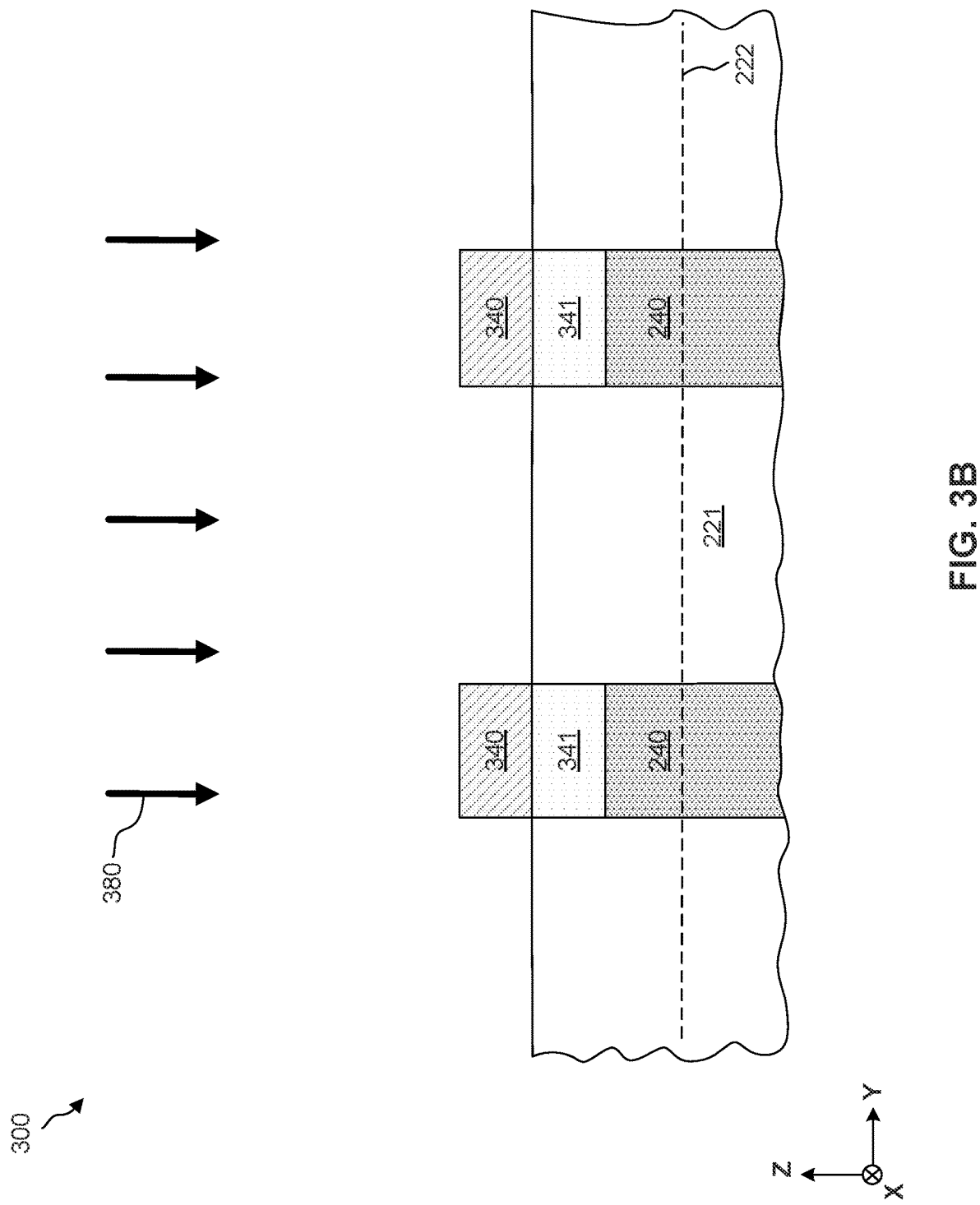

SEMICONDUCTOR DEVICE WITH DOPED STRUCTURE

This application is a continuation application of U.S. non-provisional patent application Ser. No. 17/650,867, titled "Semiconductor Device with Doped Structure," which was filed on Feb. 14, 2022, which is a continuation of U.S. non-provisional patent application Ser. No. 16/937,365, titled "Semiconductor Device With Doped Structure," which was filed on Jul. 23, 2020 and is now U.S. Pat. No. 11,251,268, which claims the benefit of U.S. Provisional Patent Application No. 62/966,866, titled "Semiconductor Device with Doped Structure," which was filed on Jan. 28, 2020, all of which are incorporated herein by reference in their entireties.

BACKGROUND

The semiconductor integrated circuit (IC) industry has experienced exponential growth. Technological advances in IC materials and design have produced generations of ICs, where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased. This scaling process provides benefits by increasing production efficiency and lowering associated costs.

BRIEF DESCRIPTION OF THE DRAWINGS

Aspects of the present disclosure are best understood from the following detailed description when read with the accompanying figures.

FIGS. 3A-3C, 4, 5A, 5B, and 6 are cross-sectional views of partially fabricated semiconductor structures, in accordance with some embodiments.

DETAILED DESCRIPTION

Figure 1:
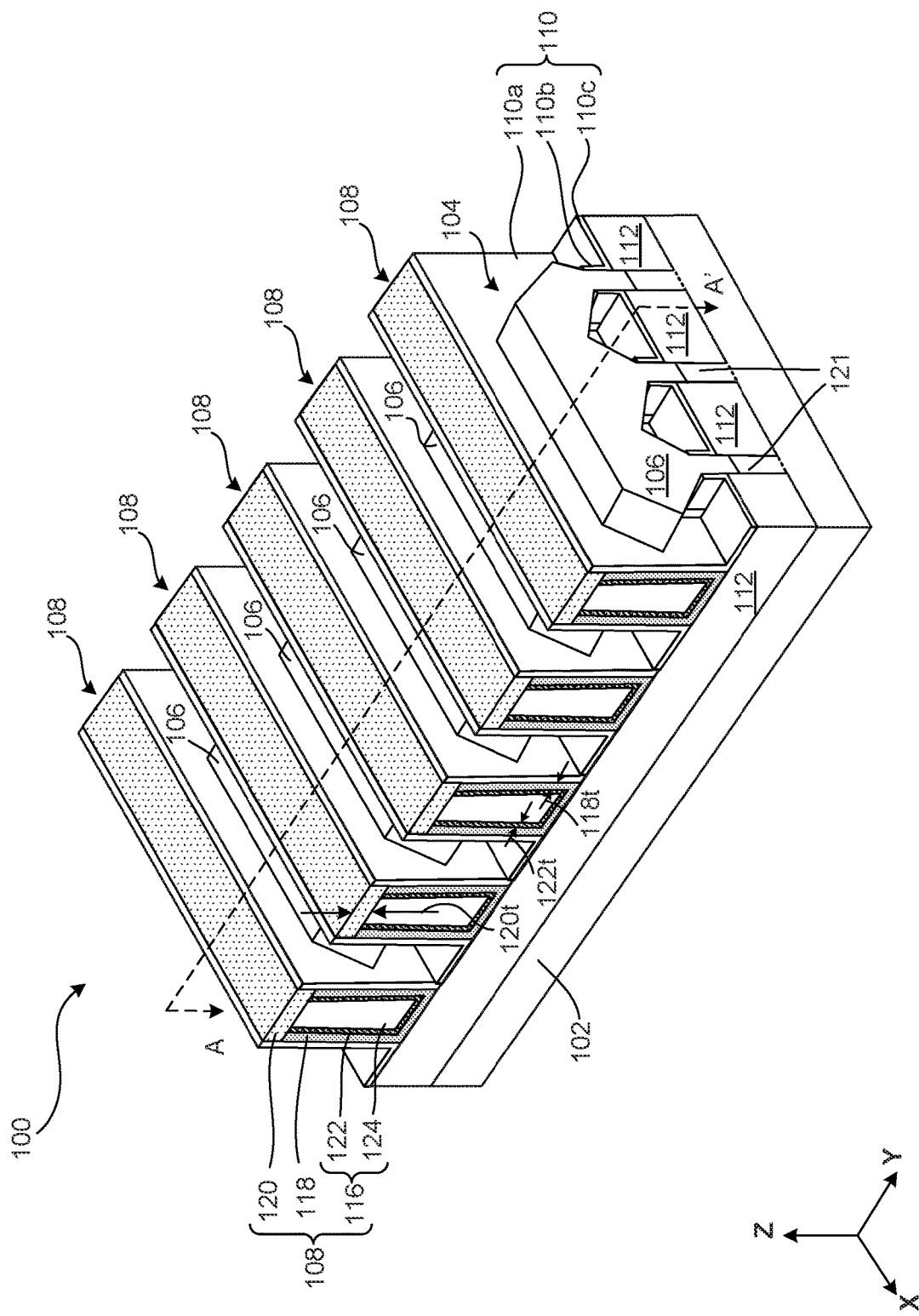
FIG. 1 is an isometric view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As planar semiconductor devices, such as metal-oxide-semiconductor field effect transistors ("MOSFETs"), are scaled down through various technology nodes, other approaches to increase device density and speed have been advanced. One approach is the fin field effect transistor ("finFET") device that is a three-dimensional FET that includes the formation of a fin-like channel extending from a substrate. FinFETs are compatible with conventional complementary metal-oxide-semiconductor (CMOS) processes, and their three-dimensional structure allows them to be aggressively scaled while maintaining gate control and mitigating short channel effects. Another approach is the gate-all-around (GAA) devices where the gate electrode surrounds the surfaces of the channel region. Gate stacks are used in planar and three-dimensional FETs for controlling the conductivity of the semiconductor device. A gate stack including a gate dielectric layer and a gate electrode for a finFET device can be formed by a replacement gate process, where a polysilicon sacrificial gate structure is replaced by a metal gate structure. Gate dielectric layers, such as a high-k dielectric layer (e.g., a dielectric layer having dielectric constant greater than about 3.9), is formed between the channel region and the gate electrode. A pair of source/drain (S/D) region of the finFETs are formed on each side of the channel region. Spacers can be disposed on sidewalls of the gate stack to protect the gate structures during fabrication processes, such as ion implantations, gate replacement processes, epitaxial source/drain structure formations, and other suitable processes.

One approach for improving the performance of a semiconductor device is to provide stress or strain in particular regions of the device. For example, inducing strain or stress in a channel region or S/D regions provides for enhanced electron or hole mobility, which can improve device speed. One approach to inducing strain or stress is doping the channel region and/or S/D regions with impurities, such as interstitial elements. Interstitial elements are larger atoms (e.g., with greater atomic radius) than the host atom. Once the host material is doped with interstitial material, an incommensurate structure with compressive stress is formed due to a lattice mismatch. Channel regions and S/D regions formed of semiconductor material, such as silicon, can be doped with interstitial elements to achieve the lattice mismatch. For example, in a p-type metal-oxide-semiconductor (MOS) device, a silicon channel and/or silicon S/D regions can be doped with germanium to increase the carrier mobility by increasing compressive strain in the silicon material. However, the germanium-doped silicon material can be oxidized during subsequent fabrication processes, limiting the carrier mobility.

To address the above shortcomings, the present disclosure provides a semiconductor device and method for fabricating the same to provide simple and cost-effective structures and processes for manufacturing a high carrier mobility channel and S/D regions in semiconductor devices. In some embodiments, the channel and/or S/D regions can be doped with lead (Pb) ions to enhance the carrier mobility without being oxidized during subsequent fabrication processes. The Pb element has the second to largest atomic radius of the Group IV elements. Doping channel regions and S/D regions formed of a lower atomic radius material (e.g., silicon) with material that has a greater atomic radius (e.g., Pb) can achieve a lattice mismatch that in turn can provide compressive strain. Channel regions and S/D regions doped with Pb can achieve superior carrier mobility than those doped with other elements, such as germanium. The compressive strain can improve the performance of semiconductor devices, such as p-type transistors. In some embodiments, the channel regions and the S/D regions can be doped with Pb by depositing a precursor layer on the silicon material, performing a thermal annealing process to drive in the Pb dopants provided by the precursor layer, and performing a treatment process such as a residue removal process to remove any process residues. In some embodiments, the Pb doping process can be performed by dopant implantation processes using suitable implantation apparatus followed by a thermal recover process.

The present disclosure provides example Pb-doped field effect transistor (FET) devices formed in a semiconductor device and/or in an integrated circuit (IC) and example methods for fabricating the same. The embodiments described herein can be implemented in finFETs and any other suitable semiconductor devices. For example, the embodiments described herein can be implemented in GAA FETs, horizontal or vertical GAA finFETs, planar FETs, or any suitable semiconductor devices.

Figure 2:
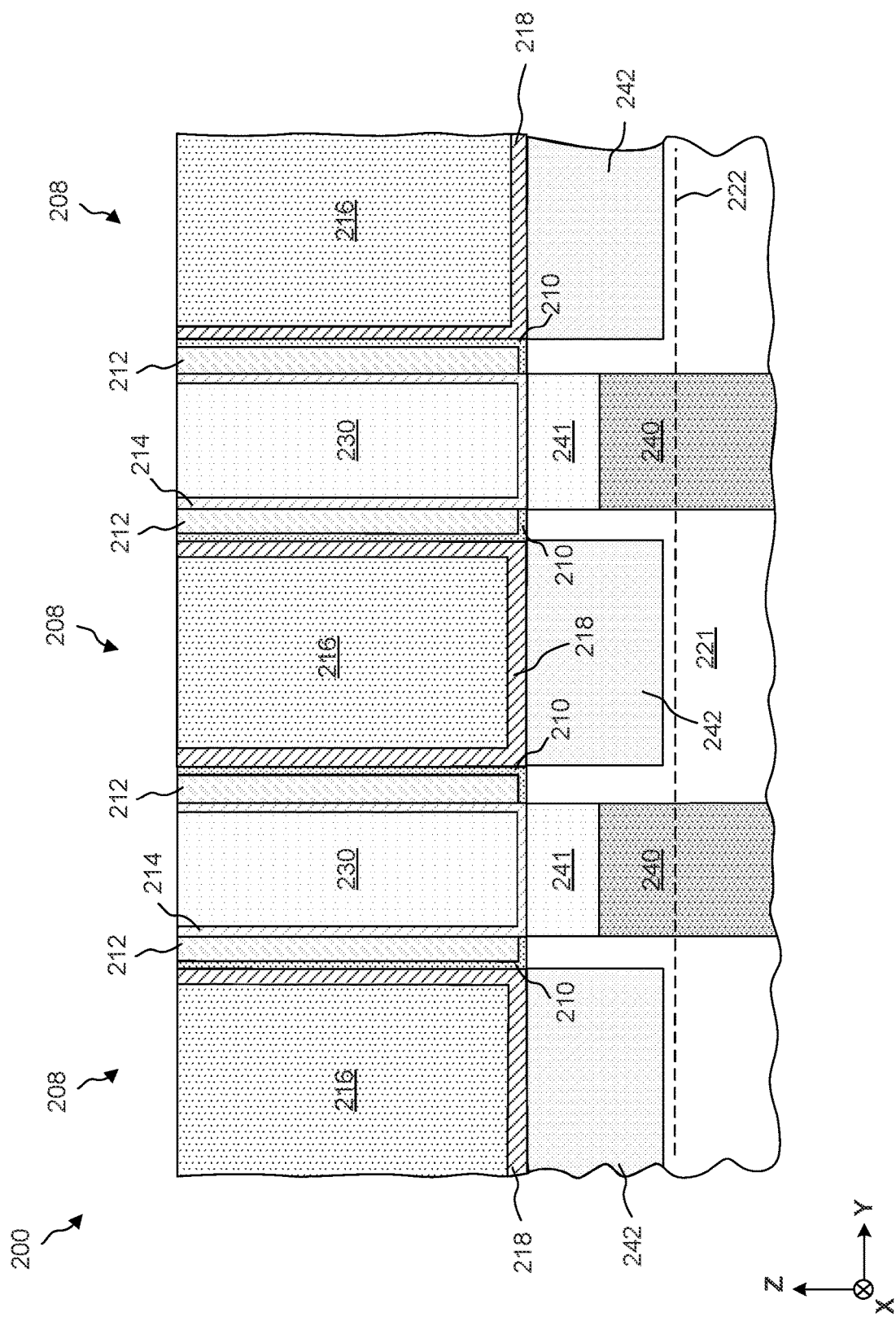
FIG. 2 is a cross-sectional view of a semiconductor structure incorporating Pb-doped source/drain regions and Pb-doped channel regions, in accordance with some embodiments.

FIG. 1 is an isometric view of exemplary fin field effect transistors (finFETs) structures. FIG. 2 is a cross-sectional view of a semiconductor device incorporating Pb-doped source/drain regions and channel regions. FIGS. 3A-3C, 4, 5A, 5B, 6, and 7 provide various exemplary semiconductor structures and fabrication processes that illustrate the formation of Pb-doped regions in semiconductor devices to improve device performance, in accordance with some embodiments. The fabrication processes provided herein are exemplary, and alternative processes in accordance with this disclosure can be performed (though they are not shown in these figures).

FIG. 1 is an isometric view of a finFET, according to some embodiments. FinFET 100 can be included in a microprocessor, memory cell, or other integrated circuit. FinFET 100 may include further suitable structures, such as additional spacers, liner layers, contact structures, and any other suitable structures, are not illustrated in FIG. 1 for the sake of clarity.

FinFET 100 can be formed on a substrate 102 and can include a fin structure 104 having fin regions 121 and S/D regions 106, gate structures 108 disposed on fin structures 104, spacers 110 disposed on opposite sides of each of gate structures 108, and shallow trench isolation (STI) regions 112. FIG. 1 shows five gate structures 108. However, based on the disclosure herein, finFET 100 can have more or fewer gate structures. In addition, finFET 100 can be incorporated into an integrated circuit through the use of other structural components—such as S/D contact structures, gate contact structures, conductive vias, conductive lines, dielectric layers, and passivation layers—that are omitted for the sake of clarity.

Substrate 102 can be a semiconductor material, such as silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structure 104 represents current-carrying structures of finFET 100 and can traverse along a Y-axis and through gate structures 108. Fin structure 104 can include: (i) portions of fin regions 121 underlying gate structures 108; and (ii) S/D regions 106 disposed on portions of fin regions 121 that are formed on opposing sides of each of gate structures 108. Portions of fin regions 121 of fin structure 104 under gate structures 108 (not shown in FIG. 1) can extend above STI regions 112 and can be wrapped around by corresponding one of gate structures 108. Fin regions 121 on opposing sides of gate structures 108 can be etched back such that S/D regions 106 can be epitaxially grown on the etched back portions of fin regions 121. In some embodiments, fin regions 121 can include an alternating stack of layers for GAA devices.

Fin regions 121 of fin structure 104 can include material similar to substrate 102. S/D regions 106 can include an epitaxially grown semiconductor material. In some embodiments, the epitaxially grown semiconductor material is the same material as substrate 102. In some embodiments, the epitaxially grown semiconductor material includes a different material from substrate 102. The epitaxially grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. Other materials for fin structure 104 are within the scope of this disclosure.

In some embodiments, S/D regions 106 can be grown by (i) chemical vapor deposition (CVD), such as by low pressure CVD (LPCVD), ultrahigh vacuum CVD (UHVCVD), reduced pressure CVD (RPCVD), or a suitable CVD process; (ii) molecular beam epitaxy (MBE) processes; (iii) a suitable epitaxial process; and (iv) combinations thereof. In some embodiments, S/D regions 106 can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 106 can be grown by selective epitaxial growth (SEG), where an etching gas is added to promote the selective growth of semiconductor material on the exposed surfaces of fin structures, but not on insulating material (e.g., dielectric material of STI regions 112). Other methods for epitaxially growing S/D regions 106 are within the scope of this disclosure.

S/D regions 106 can be doped with Pb to improve device performance. In some embodiments, S/D regions 106 can be doped by a thermal drive-in method or an implantation method. In some embodiments, the thermal drive-in method can include, for example, depositing a precursor film containing Pb on undoped S/D regions 106, performing a thermal annealing process to drive in the Pb into the underlying S/D regions 106, and performing a treatment process on the Pb-doped S/D regions 106 to remove any remaining residue. In some embodiments, S/D regions 106 can be doped using an implantation method. For example, an implantation process can be performed on undoped S/D regions 106. The implantation process can be performed using pre-determined processing parameters such that ion concentration in S/D regions 106 can reach a nominal level. A post-implantation treatment process can be performed. For example, a thermal recover process can be performed to repair damage to the crystalline structure of S/D regions 106 due to ion bombardment during the implantation process. In some embodiments, S/D regions 106 can include a silicon lead compound. For example, S/D regions can include silicon lead (SiPb), silicon germanium lead (SiGePb), silicon tin lead (SiSnPb), silicon germanium tin lead (SiGeSnPb), any suitable silicon lead compound, and/or combinations thereof.

Spacer 110 can include spacer portions 110a that form on sidewalls of gate structure 108 and are in contact with dielectric layer 118, spacer portions 110b that form on sidewalls of fin structure 104, and spacer portions 110c that form as protective layers on STI regions 106. Each spacer portion can also be a multi-spacer structure including more than one spacer structure. The low-k material for spacers 110 can be formed using suitable deposition processes, such as an atomic layer deposition (ALD). In some embodiments, spacers 110 can be deposited using CVD, LPCVD, UHVCVD, RPCVD, physical vapor deposition (PVD), any other suitable deposition processes, and combinations thereof. The seal material can be formed by depositing a first seal material on top portions of an opening formed between gate structures 108 and S/D regions 106, followed by a deposition of second seal material on the first seal material to form an enclosure having air trapped in the opening. Other materials and thicknesses for spacers 110 and seal material are within the scope of this disclosure.

Each gate structure 108 can include a gate electrode 116, a dielectric layer 118 adjacent to and in contact with gate electrode 116, and a gate capping layer 120. Gate structures 108 can be formed by a gate replacement process.

In some embodiments, dielectric layer 118 can be formed using a high-k dielectric material (e.g., dielectric material having dielectric constant greater than about 3.9). Dielectric layer 118 can be formed by CVD, atomic layer deposition (ALD), physical vapor deposition (PVD), e-beam evaporation, or other suitable processes. In some embodiments, dielectric layer 118 can include (i) a layer of silicon oxide, silicon nitride, and/or silicon oxynitride, (ii) a high-k dielectric material, such as hafnium oxide ($HfO_2$), $TiO_2$, HfZrO, $Ta_2O_3$, $HfSiO_4$, $ZrO_2$, and $ZrSiO_2$, (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, dielectric layer 118 can include a single layer or a stack of insulating material layers. Other materials and formation methods for dielectric layer 118 are within the scope of this disclosure. For example, portions of dielectric layer 118 are formed on horizontal surfaces, such as top surface of STI regions 112. Although not visible in FIG. 1, dielectric layer 118 can also be formed on top and sidewalls of fin regions 121 that are under gate electrode 116. In some embodiments, dielectric layer 118 is also formed between sidewalls of gate electrode 116 and spacer portions 110a, as shown in FIG. 1. In some embodiments, dielectric layer 118 has a thickness 118t in a range of about 1 nm to about 5 nm.

Gate electrode 116 can include a gate work function metal layer 122 and a gate metal fill layer 124. In some embodiments, gate work function metal layer 122 is disposed on dielectric layer 118. Gate work function metal layer 122 can include a single metal layer or a stack of metal layers. The stack of metal layers can include metals having work functions similar to or different from each other. In some embodiments, gate work function metal layer 122 can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and combinations thereof. Gate work function metal layer 122 can be formed using a suitable process, such as ALD, CVD, PVD, plating, or combinations thereof. In some embodiments, gate work function metal layer 122 has a thickness 122t in a range from about 2 nm to about 15 nm. Other materials, formation methods, and thicknesses for gate work function metal layer 122 are within the scope of this disclosure.

Channel regions are formed under gate electrode 116 and between S/D regions 106. Channel regions are not visible in FIG. 1 but shown in FIGS. 2-6. Channel regions can also be doped with Pb to improve device performance. In some embodiments, the atomic concentration of Pb dopants can be lower in the channel regions compared to that in S/D regions 106. For example, the atomic concentration of Pb dopants in the channel regions can be between about 50% and about 80% of that in S/D regions 106. In some embodiments, the atomic concentration of Pb dopants can be higher in the channel regions than that in S/D regions 106. Increasing the atomic concentration of Pb dopants can provide compressive stress due to lattice mismatch, which in turn can increase carrier mobility in the channel regions and the S/D regions.

Gate metal fill layer 124 can include a single metal layer or a stack of metal layers. The stack of metal layers can include metals different from each other. In some embodiments, gate metal fill layer 124 can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and combinations thereof. Gate metal fill layer 124 can be formed by ALD, PVD, CVD, or other suitable deposition processes. Other materials and formation methods for gate metal fill layer 124 are within the scope of this disclosure.

In some embodiments, gate capping layer 120 can have a thickness 120$t$ in a range from about 5 nm to about 50 nm and can protect gate structure 108 during subsequent processing of finFET 100. Gate capping layer 120 can include nitride material, such as silicon nitride, silicon-rich nitride, and silicon oxynitride. Other materials for gate capping layer 120 are within the scope of this disclosure.

STI regions 112 can provide electrical isolation to finFET 100 from neighboring active and passive elements (not illustrated herein) integrated with or deposited onto substrate 102. STI regions 112 can have a dielectric material, such as silicon oxide, silicon nitride, silicon oxynitride, fluorine-doped silicate glass (FSG), a low-k dielectric material, and other suitable insulating materials. In some embodiments, STI regions 112 can include a multi-layered structure. The cross-sectional shapes of fin structure 104, S/D regions 106, gate structures 108, spacers 110, and STI regions 112 are illustrative and are not intended to be limiting.

FIGS. 2-6 provide various exemplary semiconductor structures and fabrication processes that illustrate the formation of Pb-doped S/D regions and channel regions of semiconductor devices, in accordance with some embodiments. FIG. 7 is a flow diagram of a method 700 for forming Pb-doped S/D regions and channel regions in semiconductor structures, in accordance with some embodiments of the present disclosure. Based on the disclosure herein, other operations in method 700 can be performed. Further, the operations of method 700 can be performed in a different order and/or vary. The fabrication processes can be used to form planar semiconductor devices or vertical semiconductor devices, such as finFETs or GAA devices. In some embodiments, the fabrication processes illustrated in FIGS. 2-7 can be used to form semiconductor structures similar to finFET structures described above in FIG. 1. For example, the semiconductor structures illustrated in FIGS. 2-7 can be similar to finFET 100 during different stages of fabrication as viewed from the cut A-A' illustrated in FIG. 1.

FIG. 2 is a cross-sectional view of a semiconductor structure 200 having doped S/D regions 241 and doped channel regions 242. In some embodiments, doped S/D regions 241 and doped channel regions 242 can be doped with Pb ions through a thermal drive-in method or an implantation method. In some embodiments, semiconductor structure 200 can also include undoped S/D regions 240 formed under Pb-doped S/D regions 241. The boundaries between doped S/D regions 241 and undoped S/D regions 240 illustrated in FIGS. 2-6 are for illustration purposes and the dopant concentration can gradually decrease from doped S/D regions 241 towards undoped S/D regions 240 without an apparent boundary. In some embodiments, S/D regions 240 can also be a doped structure having a dopant concentration lower than that of doped S/D region 241. FIG. 2 shows three neighboring gate structures 208 and two S/D contacts 230 formed over a substrate. Any suitable number of gate structures and S/D contacts can be formed. The substrate can include fin region 221. Each gate stack such as gate structure 208 includes a gate dielectric layer 218 and a gate electrode 216. Gate dielectric layer 218 can be formed on sidewalls and bottom surfaces of gate electrode 216.

Fin region 221 can be current-carrying semiconductor structures formed on the substrate. For example, fin region 221 can be similar to fin region 121 described above in FIG. 1. In some embodiments, fin region 221 can include a semiconductor material, such as germanium, silicon, silicon carbide, gallium arsenide, gallium phosphide, indium phosphide, indium arsenide, indium antimonite, silicon germanium carbide, silicon germanium, gallium arsenic phosphide, gallium indium phosphide, gallium indium arsenide, gallium indium arsenic phosphide, aluminum indium arsenide, aluminum gallium arsenide, any suitable material, and combinations thereof. In some embodiments, fin region 221 can be doped with p-type or n-type dopants.

Source/drain (S/D) regions 240 can be formed in fin region 221. Doped S/D regions 241 can be formed above S/D regions 240. In some embodiments, S/D regions 240 can also be doped structures and have a dopant concentration lower than the dopant concentration of doped S/D regions 241. In some embodiments, S/D regions 240 can be undoped regions. Doped S/D regions 241 can be doped with Pb ions. In some embodiments, doped S/D regions 241 can include SiPb, SiGePb, SiSnPb, SiGeSnPb, any suitable Si—Pb compound, and/or combinations thereof. In some embodiments, the dopant concentration of Pb (e.g., the atomic ratio of the Pb dopant over the total atomic content) in doped S/D regions 241 can be between about 0.5% and about 50%. For example, the dopant concentration of Pb can be between about 0.5% and about 5%, between about 5% and about 25%, between about 25% and about 50%, or any suitable dopant concentration. Increasing the dopant concentration can improve carrier mobility. For example, the chemical formula of a Pb-doped compound can be represented as $A_xB_y$, where "A" represents the host element and "x" denotes the ratio of the host element in the chemical formula, while "B" represents the dopant element and "y" denotes the ratio of the dopant atom in the chemical formula. Using such representation, the Si—Pb compound can be represented as, for example, $Si_xPb_y$, $(SiGe)_xPb_y$, $(SiSn)_xPb_y$, $(SiGeSn)_xPb_y$. Other suitable material that forms doped S/D regions 241 can be similarly represented. In some embodiments, an atomic ratio of $y/(x+y)$ can be between about 0.5% and about 50%. In other words, the Pb element is between about 0.5% and 50% of the total atomic content. In some embodiments, S/D regions 241 can be similar to S/D regions 160 described above in FIG. 1.

Channel regions 242 are formed in fin regions 221 and between a pair of S/D regions 241. In some embodiments, channel regions 242 can be doped with dopants that can improve device performance. For example, channel regions 242 can be doped with Pb elements. In some embodiments, channel regions 242 can also be doped with other suitable elements, such as germanium, tin, any suitable elements, and/or combinations thereof. In some embodiments, channel regions 242 can be formed using Si—Pb compounds, such as $Si_xPb_y$, $(SiGe)_xPb_y$, $(SiSn)_xPb_y$, $(SiGeSn)_xPb_y$, any suitable compounds, and/or combinations thereof. In some embodiments, the atomic ratio of the Pb dopant content over the total atomic content can be between about 0.5% and about 50%.

Gate dielectric layer 218 can be formed on fin region 221 and formed using a high-k dielectric material. Gate dielectric layer 218 can deposited by CVD, ALD, PVD, e-beam evaporation, or other suitable processes. In some embodiments, gate dielectric layer 218 can include a high-k dielectric material, such as $HfO_2$. In some embodiments, gate dielectric layer 218 can include $TiO_2$, HfZrO, $Ta_2O_3$, $HfSiO_4$, $ZrO_2$, and $ZrSiO_2$. In some embodiments, gate dielectric layer 218 can be similar to dielectric layer 118 described above in FIG. 1.

Gate electrode 216 can be formed on gate dielectric layer 218 and can include a single metal layer or a stack of metal layers. Gate structures 208 can further include work function layers and are not illustrated in FIG. 2 for simplicity. The stack of metal layers can include metals having work functions similar to or different from each other. In some embodiments, gate electrode 216 can be formed of a conductive material, such as Al, Cu, W, Ti, Ta, TiN, TaN, NiSi, CoSi, Ag, TaC, TaSiN, TaCN, TiAl, TiAlN, WN, metal alloys, and combinations thereof. Gate electrode 216 can be formed using a suitable deposition process, such as ALD, CVD, PVD, plating, and combinations thereof. Other materials and formation methods for gate electrode 216 are within the scope of this disclosure. In some embodiments, gate electrode 216 can be formed using a gate replacement process, where a polysilicon gate is removed and a metal gate electrode is formed in the place of the removed polysilicon gate.

Spacer structures can be formed on sidewalls of gate structures 208. In some embodiments, gate structures can include a gate electrode, dielectric layers, spacers, any other suitable structures, and are collectively referred to as gate structures for ease of reference. In some embodiments, spacers 210 and 212 can be formed on sidewalls of gate dielectric layer 218 and on top surfaces of fin region 221. Spacer structures are formed on to protect gate structure 208 during subsequent processing. In some embodiments, spacer 210 can have an L-shaped cross section with a vertical portion formed on the sidewall of gate dielectric layer 218 and a horizontal portion formed on the top surface of fin region 221. Spacer 210 can be formed using a dielectric material, such as silicon carbide nitride, silicon nitride, silicon oxide, any suitable dielectric material, and combinations thereof. Additional spacers, such as spacer 212, can also be formed. For example, spacer 212 can be formed on the horizontal portion of spacer 210, on the top surface of fin region 221, or both. In some embodiments, spacer 212 can be formed using a dielectric material, such as silicon. In some embodiments, the materials that form spacers 210 and 212 can have high etch selectivity (e.g., greater than about 10) such that when spacer 212 is removed spacer 210 can remain substantially intact. In some embodiments, spacers 210 and 212 can be formed using any suitable dielectric material, such as silicon nitride, silicon oxynitride, silicon carbide, silicon oxycarbide, silicon on glass (SOG), tetraethoxysilane (TEOS), PE-oxide, HARP formed oxide, and combinations thereof. In some embodiments, spacers 210 and 212 can be formed using a low-k dielectric material.

Source/drain (S/D) contacts 230 can be in physical and electrical contact with doped S/D regions 241. S/D contacts 230 can be formed by depositing a conductive material between adjacent gate structures 208. For example, openings can be formed between spacers 212 to expose doped underlying S/D regions 241. A deposition process can be performed to deposit the conductive material in the openings such that electrical connections can be made. In some embodiments, a contact etch stop layer (CESL) 214 can be deposited in the opening prior to the deposition of the conductive materials. Examples of the conductive material deposition process can include PVD, sputtering, electroplating, electroless plating, any suitable deposition process, and combinations thereof. A planarization process can be performed after the deposition process such that top surfaces of gate electrode 216, spacers 210 and 212, CESL 214, and source/drain contacts 230 can be substantially coplanar (e.g., an even surface). In some embodiments, S/D contacts 230 can be formed using tungsten, aluminum, cobalt, silver, any suitable conductive material, and combinations thereof.

Similar to the finFET 100 described in FIG. 1, semiconductor structure 200 can be formed on a substrate where fin regions 221 protrude from STI regions. The STI regions are not visible from the cross-sectional view of semiconductor structure 200 illustrated in FIG. 2, but a top surface of the STI regions is represented by dashed line 222 for ease of description.

Figure 3C:
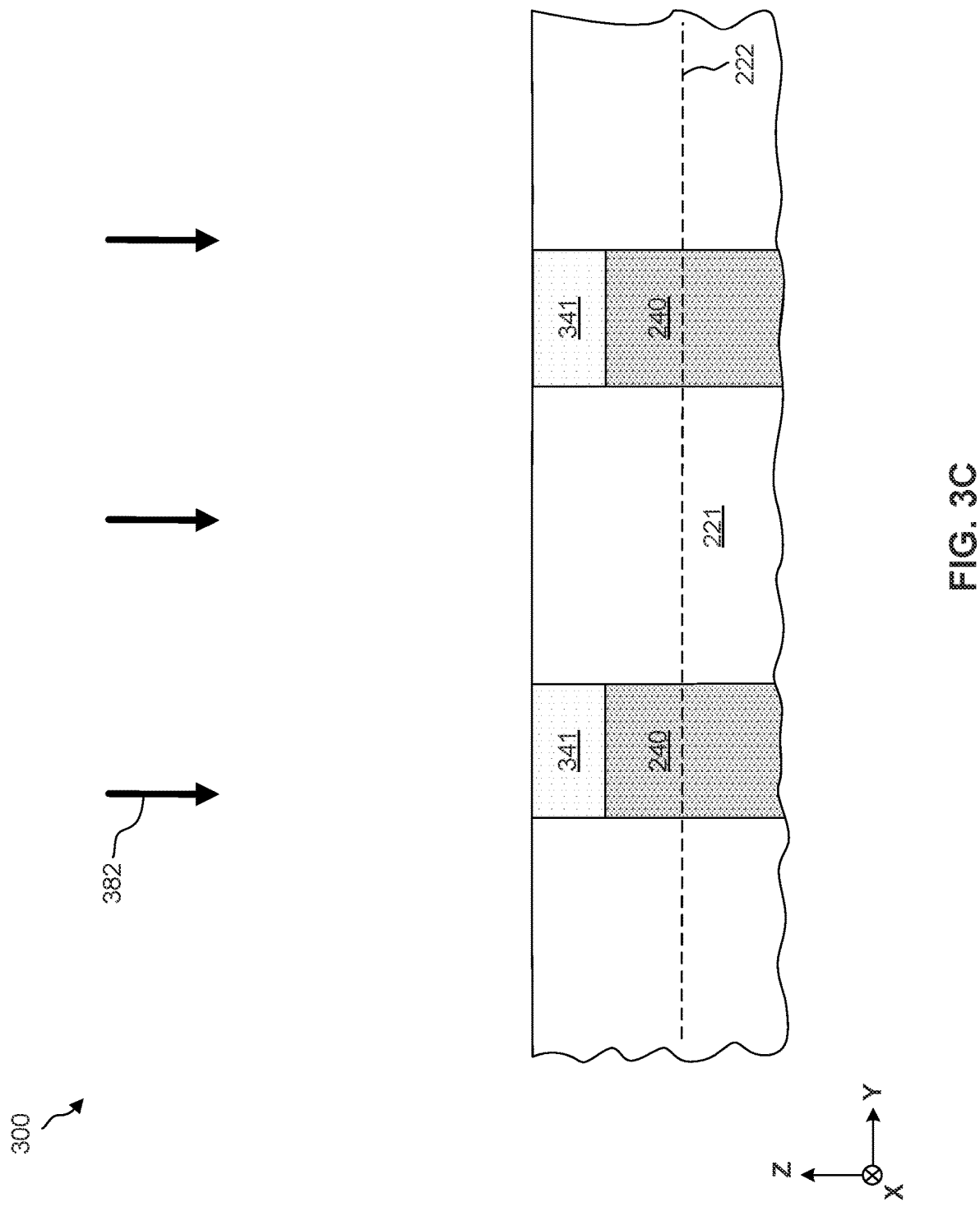
Figure 4:
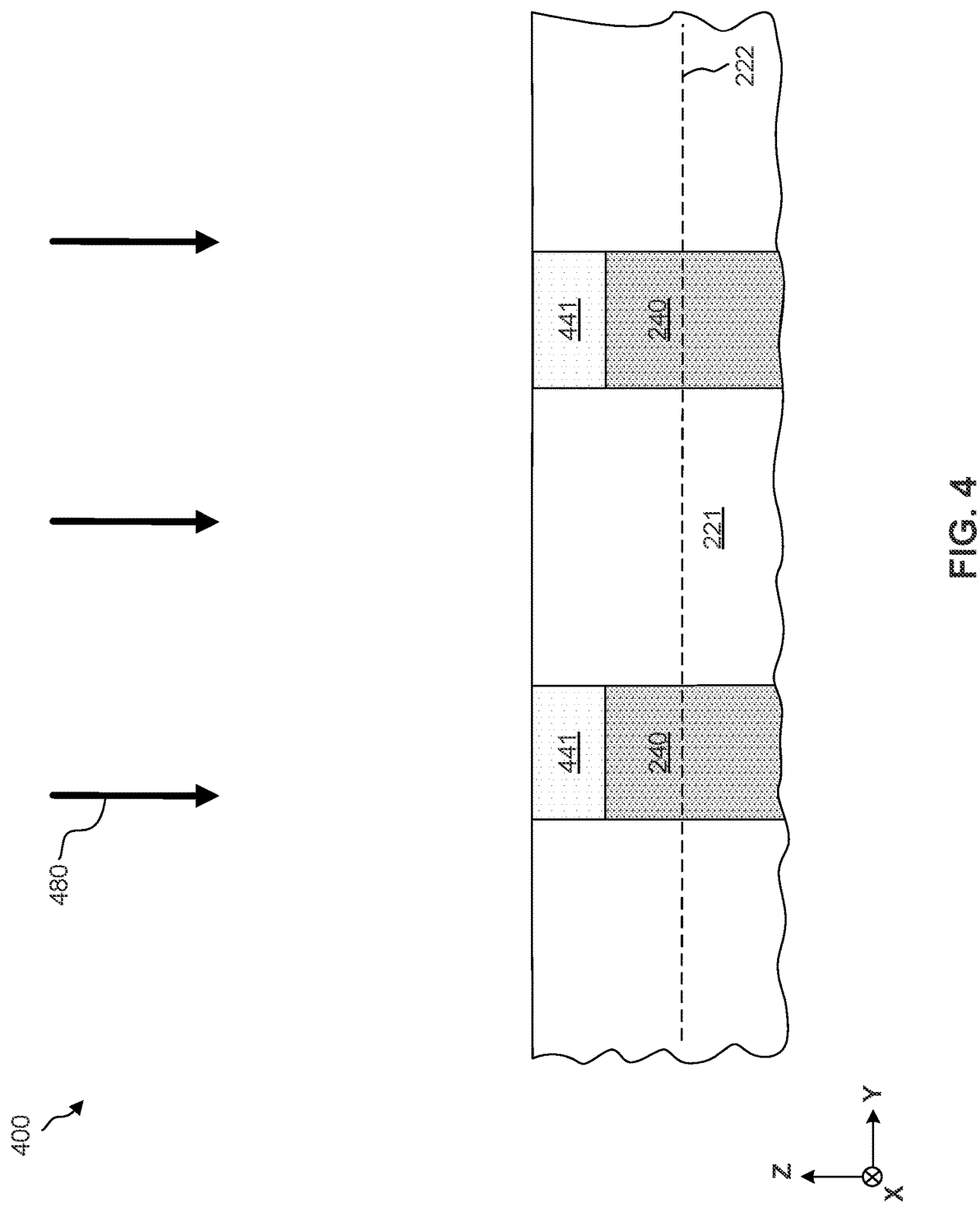
Figure 5A:
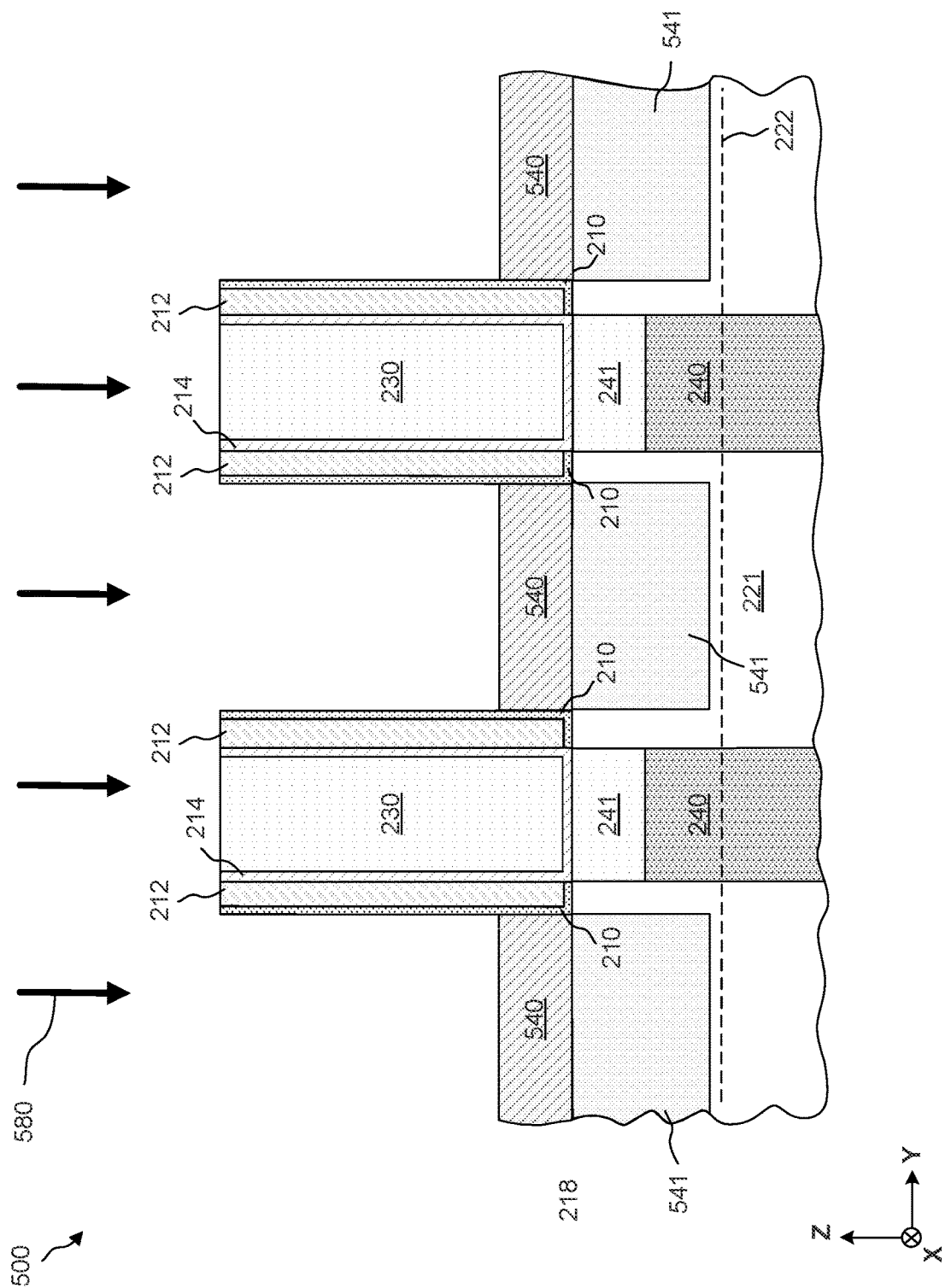
Figure 5B:
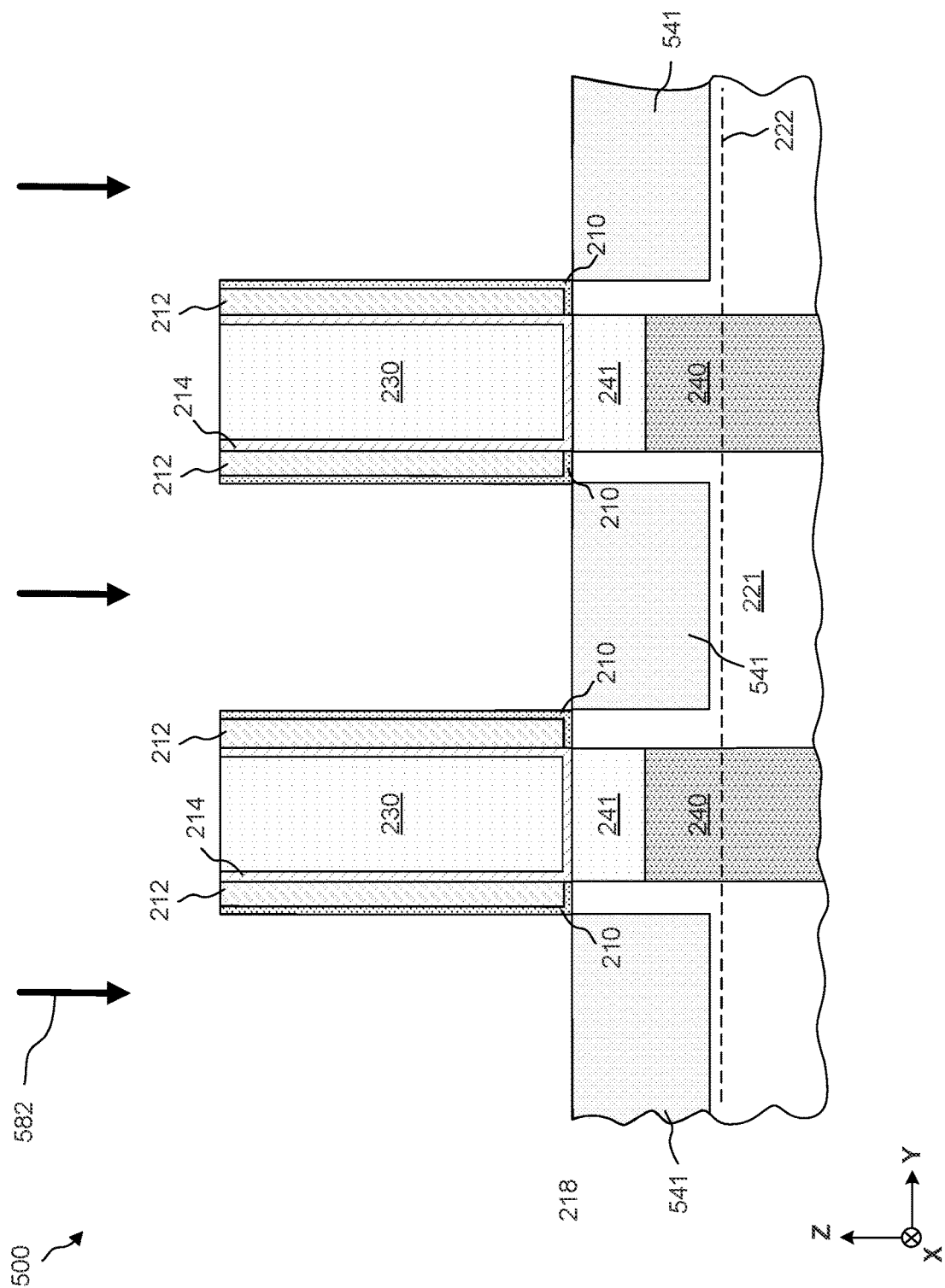
Figure 6:
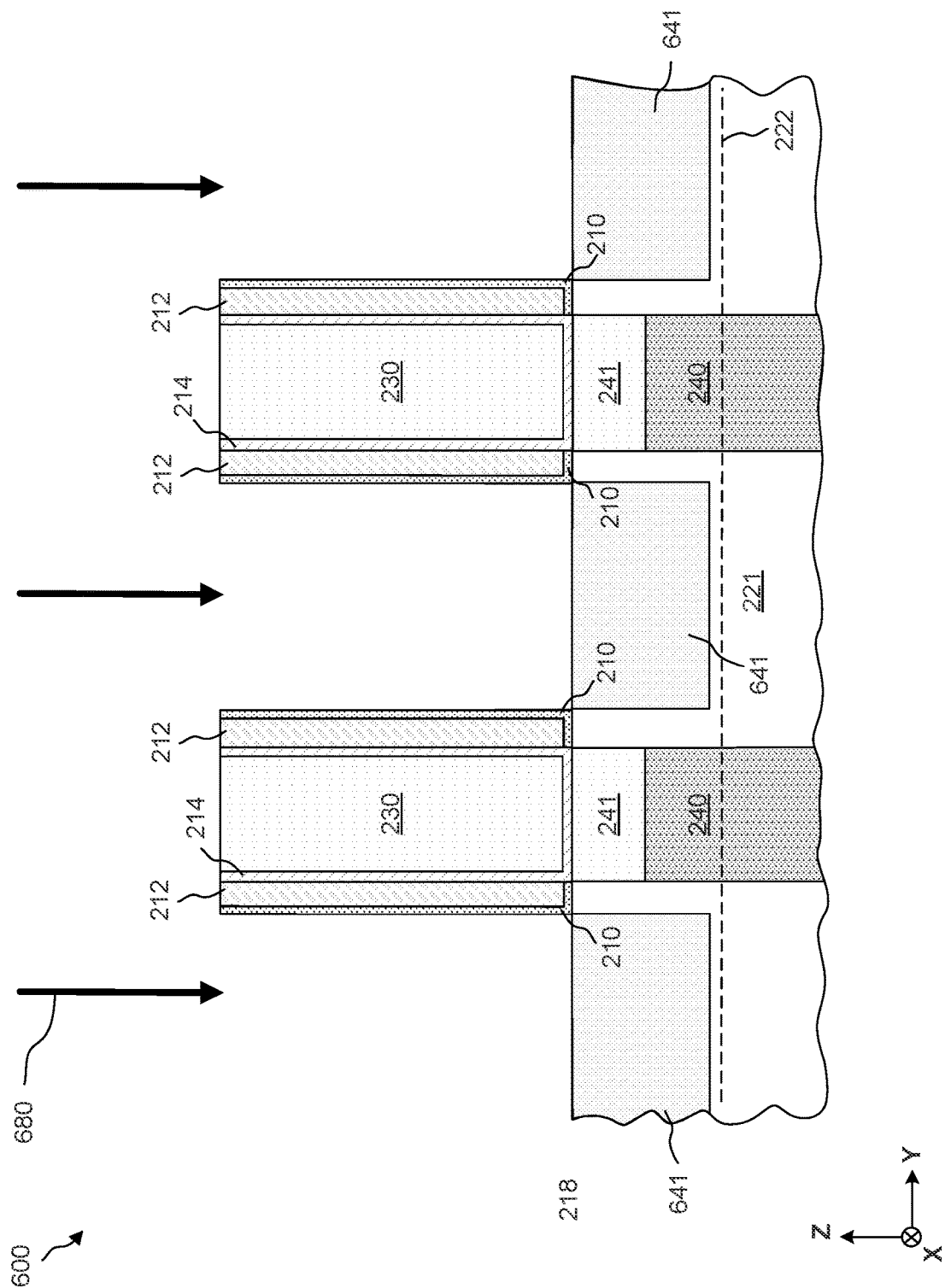
Figure 7:
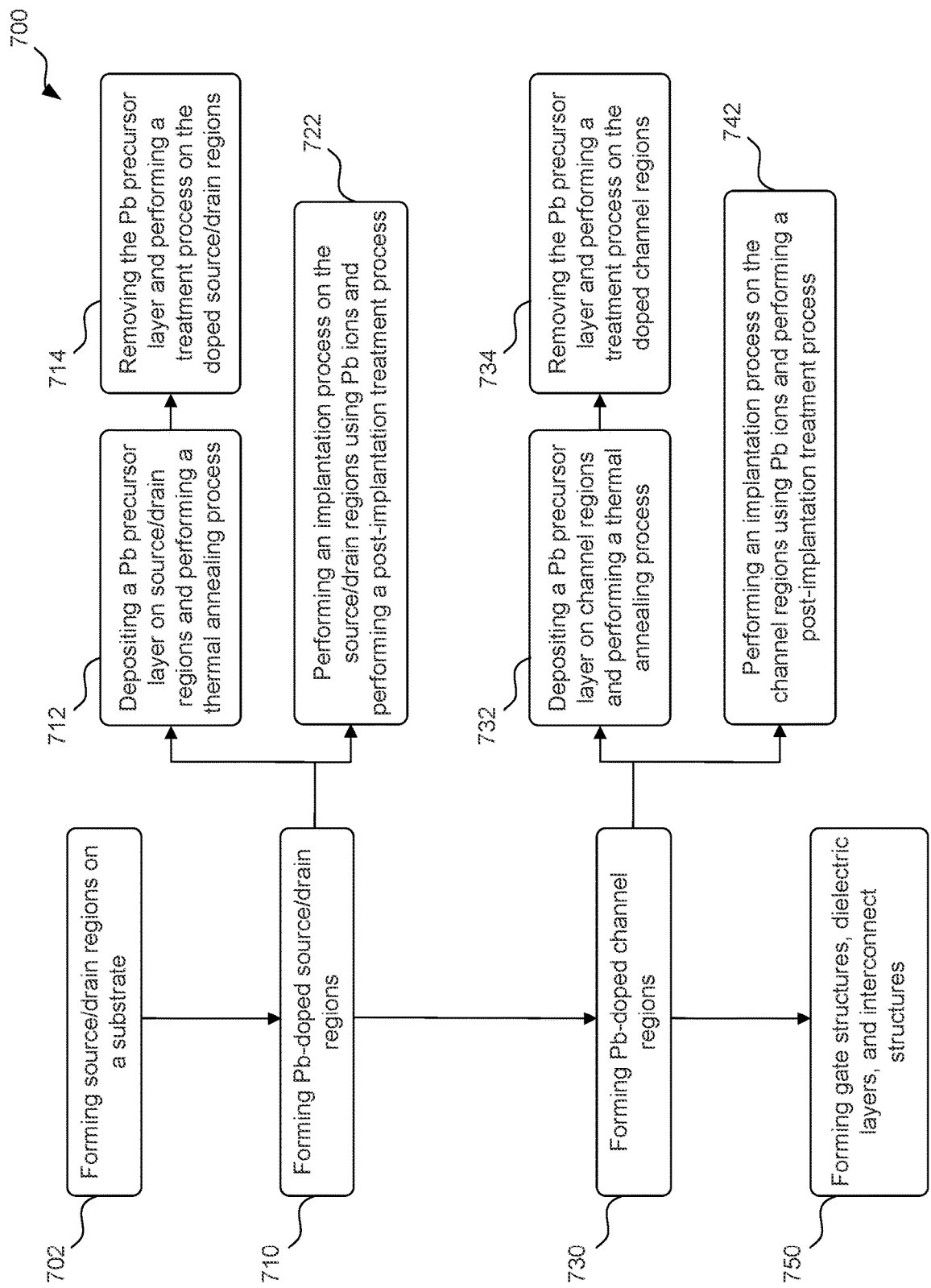
FIG. 7 is a flow diagram of a method for forming bilayer seal structures in semiconductor structures, in accordance with some embodiments.

FIGS. 3A-6 illustrate various embodiments for forming doped S/D regions and channel regions in semiconductor devices. For example, FIGS. 3A-3B and 5A-5B respectively illustrate fabrication processes for forming Pb-doped S/D regions and channel regions by depositing a precursor film and performing a thermal annealing process to drive in the Pb dopants. FIGS. 4 and 6 illustrate fabrication processes for forming Pb-doped S/D regions by an ion implantation process and a post-implantation treatment process. FIGS. 3A-6 are described with reference to method 700 of FIG. 7.

Referring to operation 702 of FIG. 7, source/drain regions are formed on a substrate, according to some embodiments. As shown in FIG. 3A, S/D drain regions 238 are formed in fin regions 221. In some embodiments, S/D regions can be formed of any suitable semiconductor material, such as silicon. In some embodiments, S/D regions 238 can be doped with dopants, such as germanium, tin, any suitable dopants, and/or combinations thereof. In some embodiments, S/D regions 238 can be grown by (i) a CVD process, such as by LPCVD, UHVCVD, RPCVD, or a suitable CVD process; (ii) MBE processes; (iii) a suitable epitaxial process; and (iv) combinations thereof. In some embodiments, S/D regions 238 can be grown by an epitaxial deposition/partial etch process, which repeats the epitaxial deposition/partial etch process at least once. In some embodiments, S/D regions 238 can be grown by a SEG process. Other methods for epitaxially growing S/D regions 106 are within the scope of this disclosure.

Referring to operation 710 of FIG. 7, source/drain regions of a semiconductor device can be doped with a suitable dopant, such as Pb, to improve device performance, according to some embodiments. In some embodiments, operation 710 can be performed in one of two ways: (1) by operations 712 and 714; or (2) by operation 722. Operations 712 and 714 describe forming Pb-doped S/D regions by depositing a Pb precursor film, performing a thermal anneal process, and performing a treatment process, according to some embodiments. Operation 722 describes forming Pb-doped S/D regions by performing an implantation process on the S/D regions using Pb ions and performing a post-implantation treatment process, according to some embodiments.

Referring to operation 712 of FIG. 7, a Pb precursor layer is deposited on S/D regions and a thermal annealing process is performed. As shown in FIG. 3B, a precursor layer 340 is deposited and a thermal anneal process 380 is performed to drive Pb ions from precursor layer 340 into the underlying substrate to form doped S/D regions 341. In some embodiments, the underlying substrate already contains material doped with other types of dopants, such as germanium, tin, and any other suitable dopants. In some embodiments, precursor layer 340 can be formed by depositing a blanket film of Pb compound and performing a patterning process such that precursor layer 340 is patterned and formed on certain regions of fin regions 221. Precursor layer 340 can be formed using any suitable deposition method. In some embodiments, precursor layer 340 can be formed using sputter or thermal evaporation deposition. In some embodiments, precursor layer 340 can be formed using CVD, ALD, LPCVD, UHVCVD, RPCVD, PVD, any other suitable deposition processes, and combinations thereof. For example, precursor layer 340 can be deposited by a CVD process using precursors, such as Bis(2,2,6,6-tetramethyl-3,5-heptanedionato)lead(II) (Pb(thd)$_2$), lead(II)thiocyanate (Pb(SCN)$_2$), lead bis(2,2,6,6,-tetramethyl-3,5-heptanedionate) (Pb(TMHD)$_2$), any suitable precursors, and/or combinations thereof. Thermal anneal process 380 is used to drive Pb ions from precursor film 340 into underlying material to form doped S/D regions 341. In some embodiments, thermal anneal process 380 can be performed at a temperature between about 300° C. and about 800° C. In some embodiments, the annealing temperature can be between about 300° C. and about 500° C., between about 500° C. and about 800° C., or any suitable temperature. The temperature of thermal anneal process 380 provides sufficient energy for Pb atoms of precursor film 340 to migrate into underlying S/D material. Increasing the annealing temperature can increase the amount of Pb atoms migrating into underlying material and can result in a higher dopant concentration of doped S/D regions 341.

Referring to operation 714 of FIG. 7, the Pb precursor layer is removed and a treatment process is performed on the doped S/D regions. Pb precursor layer 340 is removed using a suitable etching process, such as a wet chemical etching or a dry plasma etching process. Underlying doped S/D regions 341 can be exposed after the etching process and a treatment process 382 can be performed on the exposed doped S/D regions 341. As shown in FIG. 3C, treatment process 382 can remove any residual reactants from doped S/D regions 341. In some embodiments, treatment process 382 can be a wet cleaning process.

Alternatively, S/D regions can also be doped with Pb ions by an ion implantation process. Referring to operation 722 of FIG. 7, an ion implantation process can be performed to form doped S/D regions 441. As shown in FIG. 4, an implantation process 480 can be performed to dope S/D regions and form doped S/D regions 441. In some embodiments, a masking layer (not shown in FIG. 4) can be used to block off regions of fin region 221 such that S/D regions are exposed to the ion implantation process. The masking layer can be removed after the ion implantation process. Implantation process 480 can be performed using suitable parameters. For example, the energy range of Pb ions can be between about 1 keV and about 50 keV. Increasing the ion energy can provide a deeper implantation depth. In some embodiments, implantation process 480 includes exposing portions of fin region 221 to an ion beam that includes Pb ions. A post-implantation process can also be performed to repair any damage in doped S/D region 441 caused by the energetic collision by ion implantation. In some embodiments, the post-implantation process can be a thermal anneal process that can repair the crystalline structure of doped S/D region 441 and S/D region 240. For example, the post-implantation process can include heating semiconductor device 400 to a temperature between about 300° C. and about 800° C. Increasing the temperature of the post-implantation process can cause the Pb-containing material to melt.

Referring to operation 730 of FIG. 7, channel regions doped with Pb are formed in the semiconductor device, according to some embodiments. In some embodiments, operation 730 can be performed in one of two ways: (1) by operations 732 and 734; and (2) by operation 742. Similar to the formation of doped S/D regions, channel regions doped with Pb can also be formed using (i) the precursor film deposition and drive in method; (ii) the ion implantation method; or (iii) any other suitable methods. FIGS. 5A and 5B illustrate forming doped channel regions by depositing a Pb precursor film, performing a thermal anneal process, and performing a treatment process. FIG. 6 illustrates forming doped channel regions by an ion implantation process.

Referring to operation 732 of FIG. 7, a Pb precursor layer is deposited on channel regions and a thermal annealing process is performed on semiconductor device 500. As shown in FIG. 5A, a precursor layer 540 is deposited and a thermal anneal process 580 is performed to drive Pb ions from precursor layer 540 into the underlying fin region 221 to form doped channel regions 541. In some embodiments, precursor layer 540 is formed between spacers 210 and on fin regions 541, as shown in FIG. 5A. In some embodiments, precursor layer 540 can be selectively deposited. For example, precursor layer 540 can be deposited using a two-dimensional material that is attracted to the exposed surface of fin region 221 but repelled by surfaces of spacer 210 and S/D contacts 230. In some embodiments, precursor layer 540 can be formed by depositing a blanket film of Pb compound and performing a patterning process such that precursor layer 340 is formed on the S/D regions. Precursor layer 540 can be similar to precursor layer 340 described in FIG. 3B. In some embodiments, precursor layer 540 can have a thickness less than that of precursor layer 340. Other structures formed in semiconductor device 500, such as spacers 210 and 212, S/D contacts 230, and CESL 214 are similar to those described in FIG. 2 and are not described in detail here for simplicity.

A thermal anneal process 580 is used to drive in Pb ions from precursor film 540 into underlying fin region 221 to form doped channel regions 541. In some embodiments, thermal anneal process 580 can be performed at a temperature between about 300° C. and about 800° C. The temperature of thermal anneal process 580 provides sufficient energy for Pb atoms of precursor film 540 to migrate into underlying fin material. Increasing the annealing temperature can increase the amount of Pb atoms migrating into underlying S/D material and can result in a higher dopant concentration of doped channel region 541. In some embodiments, the dopant concentration of Pb in channel regions 541 can be lower than the dopant concentration of S/D regions 341 or 441. Increasing the dopant concentration of Pb can provide increased carrier mobility.

Referring to operation 734 of FIG. 7, the Pb precursor layer is removed and a treatment process is performed on the doped channel regions. Pb precursor layer 540 is removed using a suitable etching process, such as a wet chemical etching or a dry plasma etching process. Underlying doped channel regions 541 can be exposed after the etching process and a treatment process 582 can be performed on the exposed doped channel regions 541. Treatment process 582 can remove any residual reactants from doped channel regions 541. In some embodiments, treatment process 582 can be similar to treatment process 382 described in FIG.

3C. For example, treatment process 582 can be a wet cleaning process to remove residual reactants.

Alternatively, channel regions can also be doped with Pb ions by an ion implantation process. Referring to operation 742 of FIG. 7, an ion implantation process can be performed to form doped channel regions 641. As shown in FIG. 6, an implantation process 680 can be performed to dope fin region 221 and form doped channel regions 641. Implantation process 680 can be performed using suitable parameters. For example, the energy range of Pb ions can be between about 1 keV and about 50 keV. Increasing the ion energy can provide a deeper implantation depth. A post-implantation process can also be performed to repair any damage in doped channel region 641 caused by the energetic collision by ion implantation. In some embodiments, the post-implantation process can be a thermal anneal process that can repair the crystalline structure of doped channel region 641. The post-implantation process for doped channel regions 641 can be similar to the post-implantation process for doped S/D regions 441.

Referring to operation 750 of FIG. 7, gate structures, dielectric layers, and interconnect structures can be formed on the semiconductor device, according to some embodiments. For example, gate structure 208, spacers 210 and 212, S/D contacts 230 described in FIG. 2 can be formed in semiconductor device 600. In some embodiments, a gate electrode can be deposited over doped channel regions. In some embodiments, other suitable structures can also be formed and are not described in detail herein for simplicity.

Various embodiments of the present disclosure provide semiconductor devices and methods of fabricating the same to provide simple and cost-effective structures and processes for producing semiconductor devices with Pb-doped regions, such as S/D regions and channel regions. The channel regions and the S/D regions can be doped with Pb by depositing a precursor film on the silicon material, performing a thermal annealing process to drive in the Pb dopants, and performing a residue removal process to remove any process residues. In some embodiments, the Pb doping process can be performed by dopant implantation processes, followed by a thermal recover process.

In some embodiments, a semiconductor device includes first and second source/drain (S/D) regions doped with lead (Pb) at a first dopant concentration. The semiconductor device also includes a channel region between the first and second S/D regions, where the channel region is doped with Pb at a second dopant concentration that is lower than the first dopant concentration. The semiconductor device further includes first and second S/D contacts in contact with the first and second S/D regions, respectively. The semiconductor device also includes a gate electrode over the channel region.

In some embodiments, a method for forming a semiconductor device includes depositing a film on a substrate, the film comprising lead (Pb). The method also includes performing a thermal anneal process on the deposited film and the substrate to form a doped source/drain (S/D) region, where the doped S/D region includes Pb. The method further includes performing a treatment process on the doped S/D region and forming a S/D contact on the doped S/D region.

In some embodiments, a method for forming a semiconductor device includes performing an implantation process on first and second regions of a fin structure to respectively form first and second source/drain (S/D) regions. The implantation process includes exposing the first and second S/D regions to an ion beam including lead (Pb) ions and performing a post-implantation treatment process on the first and second S/D regions. The method further includes depositing first and second S/D contacts on the first and second S/D regions, respectively.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor device, comprising:
    first and second source/drain (S/D) regions doped with lead (Pb) at a first dopant concentration;
    a channel region between the first and second S/D regions, wherein the channel region is doped with Pb at a second dopant concentration that is lower than the first dopant concentration;
    first and second S/D contacts in contact with the first and second S/D regions, respectively; and
    a gate electrode on the channel region.

2. The semiconductor device of claim 1, wherein the first dopant concentration is between about 0.5% and about 50%.

3. The semiconductor device of claim 1, wherein the second dopant concentration is between about 0.5% and about 50%.

4. The semiconductor device of claim 1, wherein a ratio of the second dopant concentration to the first dopant concentration is between about 50% and about 80%.

5. The semiconductor device of claim 1, further comprising third and fourth S/D regions under and in contact with the first and second S/D regions, respectively, wherein the third and fourth S/D regions are doped with Pb at a third dopant concentration that is lower than the first dopant concentration.

6. The semiconductor device of claim 5, wherein the third and fourth S/D regions comprise silicon-lead compounds.

7. The semiconductor device of claim 5, wherein the third dopant concentration is between about 25% and about 50%.

8. The semiconductor device of claim 5, wherein the third dopant concentration is between about 0.5% and about 25%.

9. The semiconductor device of claim 1, wherein the first and second S/D regions comprise silicon lead (SiPb), silicon germanium lead (SiGePb), silicon tin lead (SiSnPb), or silicon germanium tin lead (SiGeSnPb).

10. The semiconductor device of claim 1, wherein the channel region comprises silicon lead (SiPb), silicon germanium lead (SiGePb), silicon tin lead (SiSnPb), or silicon germanium tin lead (SiGeSnPb).

11. A semiconductor device, comprising:
    a fin structure on a substrate;
    a first source/drain region on the fin structure and comprising a first region doped with a first lead concentration and a second region doped with a second lead concentration, wherein the second lead concentration is less than the first lead concentration;

a second source/drain region on the fin structure and comprising a third region doped with the first lead concentration and a fourth region doped with the second lead concentration; and a channel region between the first and second source/drain regions, wherein the channel region is doped with lead at a third lead concentration.

12. The semiconductor device of claim 11, wherein the third lead concentration is between about 50% and about 80% of the first lead concentration.

13. The semiconductor device of claim 11, wherein the second lead concertation is lower than the first lead concentration.

14. The semiconductor device of claim 11, wherein the third lead concentration is lower than the first lead concentration.

15. The semiconductor device of claim 11, further comprising an electrode disposed on the channel region.

16. A semiconductor device, comprising:
a fin structure;
first and second source/drain regions disposed on the fin structure and doped with lead at a first concentration;
a gate structure disposed between the first and second source drain regions;
a first spacer in contact with the first source/drain region;
a second spacer in contact with the first spacer; and
a gate channel region below the gate structure and doped with lead at a second concentration.

17. The semiconductor device of claim 16, wherein the second concentration is less than the first concentration.

18. The semiconductor device of claim 16, wherein the second concentration is between about 0.5% and about 50%.

19. The semiconductor device of claim 16, wherein the second spacer is L-shaped.

20. The semiconductor device of claim 16, wherein the first and second source/drain regions comprise silicon lead (SiPb), silicon germanium lead (SiGePb), silicon tin lead (SiSnPb), or silicon germanium tin lead (SiGeSnPb).

* * * * *